(12) United States Patent　　(10) Patent No.: US 9,117,740 B2
Yano et al.　　(45) Date of Patent: Aug. 25, 2015

(54) SIC SEMICONDUCTOR ELEMENT

(75) Inventors: Hiroshi Yano, Hyogo (JP); Yoshihiro Ueoka, Hyogo (JP)

(73) Assignee: NATIONAL UNIVERSITY CORPORATION NARA INSTITUTE OF SCIENCE AND TECHNOLOGY, Nara (JP)

( * ) Notice: Subject to any disclaimer, the term of this patent is extended or adjusted under 35 U.S.C. 154(b) by 0 days.

(21) Appl. No.: 13/818,810

(22) PCT Filed: Aug. 12, 2011

(86) PCT No.: PCT/JP2011/004578
§ 371 (c)(1),
(2), (4) Date: Feb. 25, 2013

(87) PCT Pub. No.: WO2012/026089
PCT Pub. Date: Mar. 1, 2012

(65) Prior Publication Data
US 2013/0285069 A1　Oct. 31, 2013

(30) Foreign Application Priority Data

Aug. 27, 2010　(JP) ................................. 2010-191438

(51) Int. Cl.
*H01L 29/16*　(2006.01)
*H01L 21/04*　(2006.01)
(Continued)

(52) U.S. Cl.
CPC .......... *H01L 29/1608* (2013.01); *H01L 21/049* (2013.01); *H01L 29/045* (2013.01); *H01L 29/7802* (2013.01); *H01L 29/7813* (2013.01)

(58) Field of Classification Search
CPC .................................................... H01L 29/1608
USPC ........................................................ 257/77
See application file for complete search history.

(56) References Cited

U.S. PATENT DOCUMENTS 5,034,090 A　7/1991　Fujimura et al.
6,593,635 B2　7/2003　Yanagisawa et al.
(Continued)

FOREIGN PATENT DOCUMENTS

JP　2001-144288 A　5/2001
JP　2002-261275 A　9/2002
(Continued)

OTHER PUBLICATIONS

Hiroshi Yano et al., Anomalously anisotropic channel mobility on trench sidewalls in 4H-SiC trench-gate metal-oxide-semiconductor field-effct transistors fabricated on 8 degree off substrates, Applied Physics Letters, 2007, vol. 90, 042102-1-042102-3.

*Primary Examiner* — Lex Malsawma
(74) *Attorney, Agent, or Firm* — Ogilvie Law Firm

(57) ABSTRACT

The invention provides an SiC semiconductor element having fewer interface defects at the interface between the SiC and the insulating film of the SiC semiconductor, as well as improved channel mobility. The semiconductor element is provided with at least an SiC semiconductor substrate and an insulating film in contact with the substrate, wherein the insulating film is formed on a specific crystal plane of the SiC semiconductor substrate, the specific crystal plane being a plane having an off-angle of 10-20° relative to the {11-20} plane toward the [000-1] direction or at an off-angle of 70-80° relative to the (000-1) plane toward the <11-20> direction. Through the use of a specific crystal plane unknown in the prior art, interface defects between the SiC semiconductor substrate and the insulating film can be reduced, and channel mobility of the semiconductor element can be improved.

20 Claims, 10 Drawing Sheets

(51) Int. Cl.
*H01L 29/04* (2006.01)
*H01L 29/78* (2006.01)

(56) References Cited

U.S. PATENT DOCUMENTS

| | | |
|---|---|---|
| 7,332,758 B2 | 2/2008 | Yamabi et al. |
| 7,441,590 B2 | 10/2008 | Yano et al. |
| 7,521,707 B2 | 4/2009 | Kawasaki et al. |
| 7,648,867 B2 | 1/2010 | Watanabe et al. |
| 7,692,227 B2 | 4/2010 | Yamabi et al. |
| 8,395,162 B2 * | 3/2013 | Nakano et al. ............... 257/77 |
| 2007/0057262 A1 | 3/2007 | Nakamura et al. |
| 2007/0221119 A1 * | 9/2007 | Kimoto et al. ............... 117/84 |
| 2007/0281484 A1 * | 12/2007 | Ishibashi et al. ............ 438/692 |
| 2009/0072244 A1 * | 3/2009 | Harada et al. ............... 257/77 |
| 2011/0017998 A1 * | 1/2011 | Nakano et al. ............... 257/66 |

FOREIGN PATENT DOCUMENTS

| | | |
|---|---|---|
| JP | 2004-281875 A | 10/2004 |
| JP | 2010-040564 A | 2/2010 |
| WO | 2010/116886 | 10/2010 |

* cited by examiner (1)　　　　　　　　(2)

SIC SEMICONDUCTOR ELEMENT

TECHNICAL FIELD

The present invention relates to a technology for reducing interface defects on an insulating film (oxide film) and an SiC semiconductor of an SiC semiconductor element and improving channel mobility of a MOSFET (MOS field-effect transistor) or the like.

BACKGROUND ART

An SiC semiconductor is a semiconductor made of SiC (silicon carbide) which is a compound of carbon (C) and silicon (Si). A most distinctive feature of the SiC semiconductor is to have a physical value suitable as a material of semiconductor devices (power devices) used in power electronics. For example, in the case of commercially available single-crystal 4H—SiC, a band gap is 3.3 eV which is three times as wide as the conventional Si semiconductor, dielectric breakdown field strength is 3 MV/cm which is about ten times as high as the conventional Si semiconductor and saturation electron velocity is three times as fast as the conventional Si semiconductor. Further, the SiC semiconductor is better in thermal conductivity, heat resistance and chemical resistance than the conventional Si semiconductor and also has a feature of having a higher radiation resistance than the Si semiconductor. From these features, the SiC semiconductor, particularly MOSFETs (MOS field-effect transistors) of SiC is preferably used for semiconductor devices used in power electronics.

However, it has been conventionally problematic that there are many defects in an interface between a gate insulating film (gate oxide film) and SiC and channel mobility is low in MOSFETs of SiC. Particularly, electron mobility in a bulk crystal is as high as 800 to 1000 $cm^2/Vs$ in 4H—SiC, whereas it has been a problem that the channel mobility (Si-face) of MOSFETs of SiC is as low as 10 $cm^2/Vs$.

Further, conventionally, an insulating film has been formed by thermal oxidation of SiC or using a CVD method and an interface between the formed insulating film and SiC has been nitrided such as by NO, $NO_2$ or $NH_3$ gas, thereby reducing defects in the interface to improve the channel mobility. However, the channel mobility (Si-face) of the MOSFET of SiC is as low as 40 to 50 $cm^2/Vs$ even if the interface is nitrided and a further improvement in the channel mobility is much-needed.

The channel mobility of the MOSFET of SiC is low because there are many defects in the interface of SiC produced by conventional technologies, i.e. interface state density is high. Due to the low channel mobility of the MOSFET of SiC, an on-resistance value of the MOSFET increases. If the on-resistance value of the transistor increases, power consumption increases.

As described above, despite the fact that the electron mobility in the bulk crystal is originally as high as 800 to 1000 $cm^2/Vs$ in 4H—SiC, the channel mobility is reduced due to defects (magnitude of the interface state density) if SiC is incorporated in devices such as a MOSFET. That is, by device integration, the potential of SiC originally having a high electron mobility cannot be utilized at all.

Conventionally, in order to address the above problems, some improvements have been made to the methods of forming a gate insulating film through thermal oxidation, CVD, interface nitridation, and the like to reduce the number of interface defects and thereby improve the channel mobility.

On the other hand, in order to address the above problems, there have also been known techniques focusing on the crystal plane of SiC to improve the channel mobility. Some of the techniques focusing on the crystal plane of SiC will now be introduced.

First, in the fabrication of devices such as DMOSFETs (Double implanted MOSFETs) and UMOSFETs (trenched MOSFETs), generally used is a crystal plane having an off-angle of 4 or 8 degrees in the <11-20> direction with respect to the (0001) Si-plane (Si-face) or the (000-1) C-plane (C-face) in a standard SiC wafer. However, the channel mobility on the (0001) plane or the (000-1) plane is not so high.

A higher channel mobility has been reported not on the (0001) plane or the (000-1) plane but on the {11-20} plane, which is perpendicular to the {0001} plane, but it is known that misalignment of the crystal plane could lead to a reduction in mobility. Using the {11-20} plane thus allows the channel mobility to be improved, although up to about 6 $cm^2/Vs$ at the highest.

It is also known that using a crystal plane having an off-angle within the range of 50 to 65 degrees in the <01-10> direction with respect to the {0001} plane allows the number of interface defects to be reduced and thereby the channel mobility to be improved (see Patent Document 1).

It is further known that using the {03-38} plane also allows the channel mobility to be improved (see Patent Document 2). Here, the {03-38} plane is a crystal plane having an off-angle of 54.7 degrees in the <1-100> direction with respect to the {0001} plane.

Using the {03-38} plane thus allows the channel mobility to be improved, although up to about 11 $cm^2/Vs$ at the highest.

It is noted that crystal planes and directions, which are crystallographically expressed in numeric characters with a bar overhead, will be expressed in numeric characters with a minus sign (−) placed in front, instead of with a bar overhead, due to limitations of description in the specification, abstract, and claims of the present invention. It is also noted that [ ] will be used to express an individual direction indicating an intracrystalline direction, < > will be used to express a collective direction indicating all equivalent directions, ( ) will be used to express an individual plane indicating a crystal plane, and { } will be used to express a collective plane indicating equivalent symmetric planes. It is further noted that in the accompanying drawings, crystal planes and directions will be in the original crystallographic expression, that is, expressed in numeric characters with a bar overhead.
[Patent Document 1] JPA-2010-040564
[Patent Document 2] JPA-2002-261275

OUTLINE OF THE INVENTION

Problems to be Solved by the Invention

In view of the above situation, an object of the present invention is to provide an SiC semiconductor element, in which the interface state density of an interface between an insulating film in contact with an SiC semiconductor and SiC is reduced to improve channel mobility.

Means to Solve the Objects

The inventors have found that using a conventionally-unknown specific crystal plane of SiC as, for example, a trench side wall of a MOSFET allows the number of interface defects between the insulating film and the SiC to be reduced significantly and thereby the channel mobility to be improved significantly, and thus completed the present invention.

That is, in order to achieve the foregoing object, the present invention provides an SiC semiconductor device including at least an SiC semiconductor substrate and an insulating film in contact with the substrate, in which the insulating film is formed on a crystal plane of the SiC semiconductor substrate, the plane having an off-angle of 10 to 20 degrees in the [000-1] direction with respect to the {11-20} plane or having an off-angle of 70 to 80 degrees in the <11-20> direction with respect to the (000-1) plane.

Thus using a specific crystal plane allows the number of interface defects between the SiC semiconductor substrate and the insulating film to be reduced and thereby the channel mobility of the semiconductor device to be improved.

Here, it is noted that the plane having an off-angle of 10 to 20 degrees in the [000-1] direction with respect to the {11-20} plane is the same as the plane having an off-angle of 70 to 80 degrees in the <11-20> direction with respect to the (000-1) plane. That is, as an example, "the plane having an off-angle of 10 degrees in the [000-1] direction with respect to the {11-20} plane" is the same as "the plane having an off-angle of 80 degrees in the <11-20> direction with respect to the (000-1) plane." In consideration of the angular relationship, "the plane having an off-angle of 10 to 20 degrees in the [000-1] direction with respect to the {11-20} plane is the same as the plane having an off-angle of 70 to 80 degrees in the <11-20> direction with respect to the (000-1) plane" can also be said to be "the plane having an off-angle of 10 to 20 degrees in the [000-1] direction with respect to the {11-20} plane is the same as the plane having an off-angle of 80 to 70 degrees in the <11-20> direction with respect to the (000-1) plane." The {11-20} plane indicates an equivalent symmetric individual plane (11-20), (1-210), or (-2110). The (000-1) plane indicates the C plane. The insulating film includes an oxide film and a nitride film.

It is noted that a "plane having an off-angle" can also be expressed as a "plane having a tilt angle" of a predetermined value in a predetermined direction with respect to a predetermined plane according to the present invention. The crystal plane having an off-angle is thus a plane having a tilt angle of a predetermined value in a predetermined direction with respect to a predetermined plane according to the present invention.

It is particularly preferable that the insulating film is formed on a crystal plane of the SiC semiconductor substrate, the plane having an off-angle of 15 degrees in the [000-1] direction with respect to the {11-20} plane or having an off-angle of 75 degrees in the <11-20> direction with respect to the (000-1) plane. It allows the number of interface defects between the SiC semiconductor substrate and the insulating film to be reduced and the channel mobility of the semiconductor device to be improved.

The present invention also provides an SiC semiconductor device including at least an SiC semiconductor substrate and an insulating film in contact with the substrate, in which the insulating film is formed on a crystal plane of the SiC semiconductor substrate, the plane having an off-angle of 10 to 20 degrees in the [000-1] direction with respect to the {1-100} plane or having an off-angle of 70 to 80 degrees in the <1-100> direction with respect to the (000-1) plane.

Thus using a specific crystal plane allows the number of interface defects between the SiC semiconductor substrate and the insulating film to be reduced and thereby the channel mobility of the semiconductor device to be improved.

Here, it is noted that the plane having an off-angle of 10 to 20 degrees in the [000-1] direction with respect to the {1-100} plane is the same as the plane having an off-angle of 70 to 80 degrees in the <1-100> direction with respect to the (000-1) plane. The {1-100} plane indicates an equivalent symmetric individual plane (1-100), (–1010), or (01-10).

It is particularly preferable that the insulating film is formed on a crystal plane of the SiC semiconductor substrate, the plane having an off-angle of 15 degrees in the [000-1] direction with respect to the {1-100} plane or having an off-angle of 75 degrees in the <1-100> direction with respect to the (000-1) plane. It allows the number of interface defects between the SiC semiconductor substrate and the insulating film to be reduced and the channel mobility of the semiconductor device to be improved.

The present invention further provides an SiC semiconductor device including at least an SiC semiconductor substrate and an insulating film in contact with the substrate, in which the insulating film is formed on a crystal plane of the SiC semiconductor substrate, the plane having an off-angle of 10 to 20 degrees in the [000-1] direction with respect to the {–12-10} plane or having an off-angle of 70 to 80 degrees in the <–12-10> direction with respect to the (000-1) plane.

Thus using a specific crystal plane allows the number of interface defects between the SiC semiconductor substrate and the insulating film to be reduced and thereby the channel mobility of the semiconductor device to be improved.

Here, it is noted that the plane having an off-angle of 10 to 20 degrees in the [000-1] direction with respect to the {–12-10} plane is the same as the plane having an off-angle of 70 to 80 degrees in the <–12-10> direction with respect to the (000-1) plane. The {–12-10} plane indicates an equivalent symmetric individual plane (–12-10), (2-1-10), or (–1-120).

The {–12-10} plane has an atomic arrangement structure similar to that of the {11-20} plane. That is, in each unit cell structure of SiC, the {–12-10} and {11-20} planes have atomic arrangement structures symmetrical with respect to the crystal axis and out of alignment by half the unit cell structure in the axial direction. These crystal planes are similar in a macroscopic view.

It is particularly preferable that the insulating film is formed on a crystal plane of the SiC semiconductor substrate, the plane having an off-angle of 15 degrees in the [000-1] direction with respect to the {–12-10} plane or having an off-angle of 75 degrees in the <–12-10> direction with respect to the (000-1) plane. It allows the number of interface defects between the SiC semiconductor substrate and the insulating film to be reduced and the channel mobility of the semiconductor device to be improved.

The present invention also provides an SiC semiconductor device including at least an SiC semiconductor substrate and an insulating film in contact with the substrate, in which the insulating film is formed on a crystal plane of the SiC semiconductor substrate, the plane having an off-angle of 10 to 20 degrees in the [000-1] direction with respect to the {10-10} plane or having an off-angle of 70 to 80 degrees in the <10-10> direction with respect to the (000-1) plane.

Thus using a specific crystal plane allows the number of interface defects between the SiC semiconductor substrate and the insulating film to be reduced and thereby the channel mobility of the semiconductor device to be improved.

Here, it is noted that the plane having an off-angle of 10 to 20 degrees in the [000-1] direction with respect to the {10-10} plane is the same as the plane having an off-angle of 70 to 80 degrees in the <10-10> direction with respect to the (000-1) plane. The {10-10} plane indicates an equivalent symmetric individual plane (10-10), (0-110), or (–1100).

The {10-10} plane has an atomic arrangement structure similar to that of the {1-100} plane. That is, in each unit cell structure of SiC, the {10-10} and {1-100} planes have atomic arrangement structures symmetrical with respect to the crystal axis and out of alignment by half the unit cell structure in the axial direction. These crystal planes are similar in a macroscopic view.

It is particularly preferable that the insulating film is formed on a crystal plane of the SiC semiconductor substrate, the plane having an off-angle of 15 degrees in the [000-1] direction with respect to the {10-10} plane or having an off-angle of 75 degrees in the <10-10> direction with respect to the (000-1) plane. It allows the number of interface defects between the SiC semiconductor substrate and the insulating film to be reduced and the channel mobility of the semiconductor device to be improved.

Thus using a specific crystal plane in the SiC semiconductor substrate according to the present invention allows the number of interface defects between the SiC semiconductor substrate and the insulating film to be reduced and thereby the channel mobility of the semiconductor device to be improved to 90 cm$^2$/Vs or more.

In the SiC semiconductor device according to the present invention, the crystal plane is preferably used as a trench side wall of a trench-gated MOSFET using the SiC semiconductor substrate.

In the SiC semiconductor device according to the present invention, thus using the crystal plane as a trench side wall of a trench-gated MOSFET allows the device property to be improved significantly. Upon this, a trench-gated MOSFET was actually fabricated and the drain current was measured to evaluate the channel mobility in an embodiment to be described hereinafter.

Here, it is noted that the shape of the trench side wall is not particularly restricted and may be stripe-shaped like a groove or honeycomb-shaped like a hexagonal hole. In addition, the side wall may be formed perpendicularly or obliquely at a predetermined tapered angle with respect to the substrate surface as long as the crystal plane according to the present invention is used as the side wall.

Furthermore, in the SiC semiconductor device according to the present invention, the insulating film is preferably used as a gate insulating film or a surface passivation film. The insulating film includes an oxide film and a nitride film.

Since the number of interface defects between the insulating film and the SiC can be reduced, using the film as a gate insulating film allows the channel mobility of, for example, a MOSFET to be improved, leading to a reduction in on-resistance of the transistor. Alternatively, using the film as a surface passivation film allows the carrier recombination at the SiC surface, that is, at the interface between the SiC and the insulating film to be suppressed, leading to a reduction in leak current and/or an improvement in the gain of, for example, bipolar transistors and thyristors.

The crystal structure of the SiC semiconductor is only required to have a hexagonal crystal structure, and for example, 4H—SiC, 6H—SiC, or 15R—SiC (rhombohedral crystal) can be used. In the case where an FET is used as the semiconductor device according to the present invention, the channel may be either an n-type channel or a p-type channel.

Effects of the Invention

According to the present invention, it is possible to improve the channel mobility dramatically compared to a conventionally-used crystal plane. In addition, exerting a lower threshold voltage and a characteristic of a steep rise in the drain current, if SiC-based power MOSFETs are fabricated with the crystal plane according to the present invention used as a channel, this will lead to advantageous effects of achieving a lower on-resistance and thereby a reduction in power consumption of such power devices.

Moreover, the crystal plane according to the present invention, which has a smaller number of interface defects than other crystal planes, has the advantageous effect of achieving a smaller change in temperature due to device property and therefore an improvement in the device property.

BEST MODE FOR CARRYING OUT THE INVENTION

Embodiments of the present invention will be described in detail below with reference to the drawings. The present invention is not limited to the following embodiment and examples of shown in the figure, and the present invention can be variously changed in design.

Figure 1:
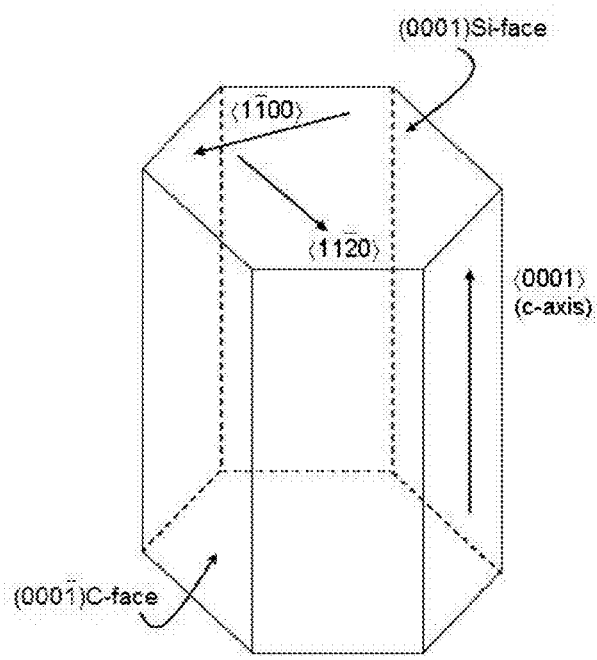
FIG. 1 illustrates crystal planes of a 4H—SiC unit cell.

First, crystal planes of a 4H—SiC unit cell will be described with reference to FIGS. 1 and 2. FIG. 1 shows a unit cell structure of SiC crystal. Major hexagonal SiC structures include 4H—SiC in which layers each consisting of one Si—C pair are laminated in a four-layer cycle in the c-axis direction and 6H—SiC in which layers are laminated in a six-layer cycle. Four layers for 4H—SiC and six layers for 6H—SiC are included in the lattice of the unit cell structure shown in FIG. 1.

Figure 2:
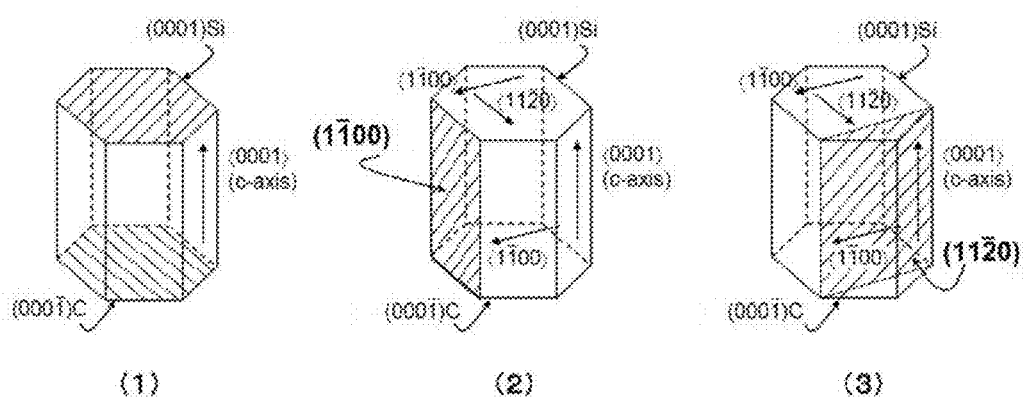
FIG. 2 illustrates crystal planes of a 4H—SiC unit cell.

In FIG. 2(1), the upper surface of the hexagonal column is the (0001) Si-plane (Si-face) and the bottom surface is the (000-1) C-plane (C-face). In FIG. 2(2), the side surface of the hexagonal column is the (1-100) plane. In FIG. 2(3), the plane perpendicular to the (1-100) plane shown in FIG. 2(2) is the (11-20) plane.

Figure 3:
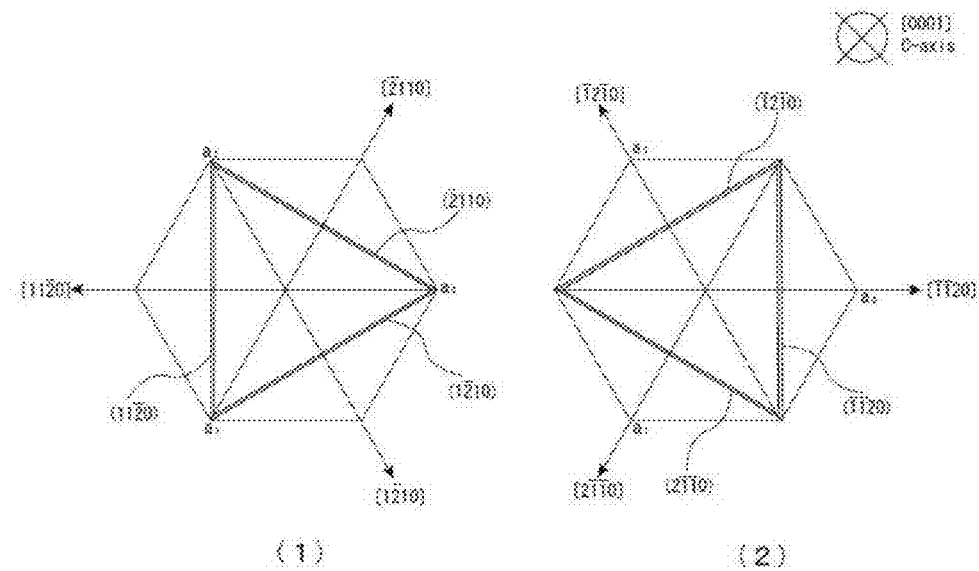
FIG. 3 illustrates crystal planes and directions of a 4H—SiC unit cell.

FIG. 3 is a plan view of the bottom surface of the hexagonal column, that is, the (000-1) C-plane. The hexagons shown in FIGS. 3(1) and 3(2) have three directions a1, a2, and a3, and the direction bisecting the angle between a1 and a2 is [11-20], the direction 120 degrees counterclockwise therefrom is [1-210], and further 120 degrees is [-2110]. The plane of which normal is in the [11-20] direction is (11-20) plane. The directions a1, a2, and a3 are, respectively, in the [2-1-10], [-12-10], and [-1-120] directions.

Figure 4:
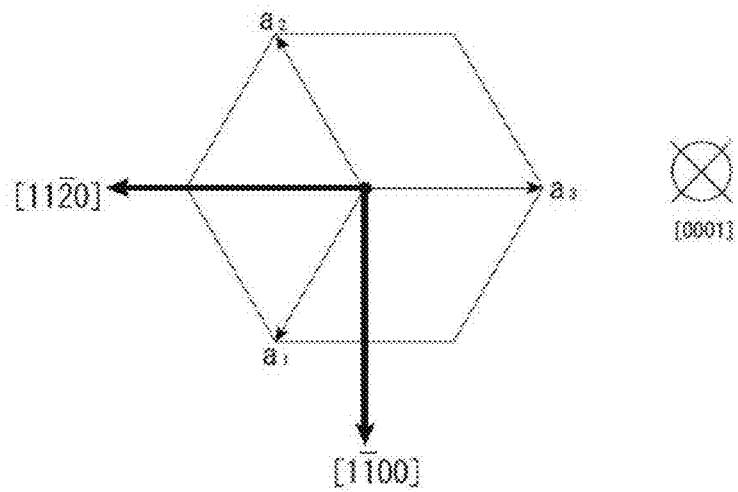
FIG. 4 illustrates crystal planes and directions of a 4H—SiC unit cell.

As shown in FIG. 4, the [11-20] and [1-100] directions are at right angles to each other.

Figure 5:
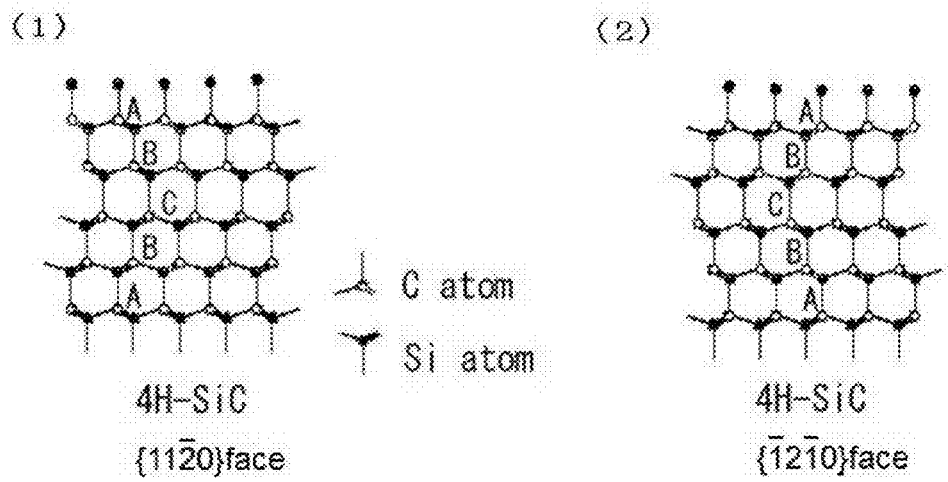
FIG. 5 schematically shows the structure of a 4H—SiC.

FIG. 5 schematically shows the structure of 4H—SiC. FIG. 5(1) schematically shows the structure on the {11-20} plane and FIG. 5(2) schematically shows the structure on the {-12-10} plane. The {11-20} and {-12-10} planes have a similar atomic arrangement structure. In each unit cell structure of SiC, the {11-20} and {-12-10} planes have atomic arrangement structures symmetrical with respect to the crystal axis and out of alignment by half the unit cell structure in the c-axis direction. These crystal planes are similar in a macroscopic view.

Figure 6:
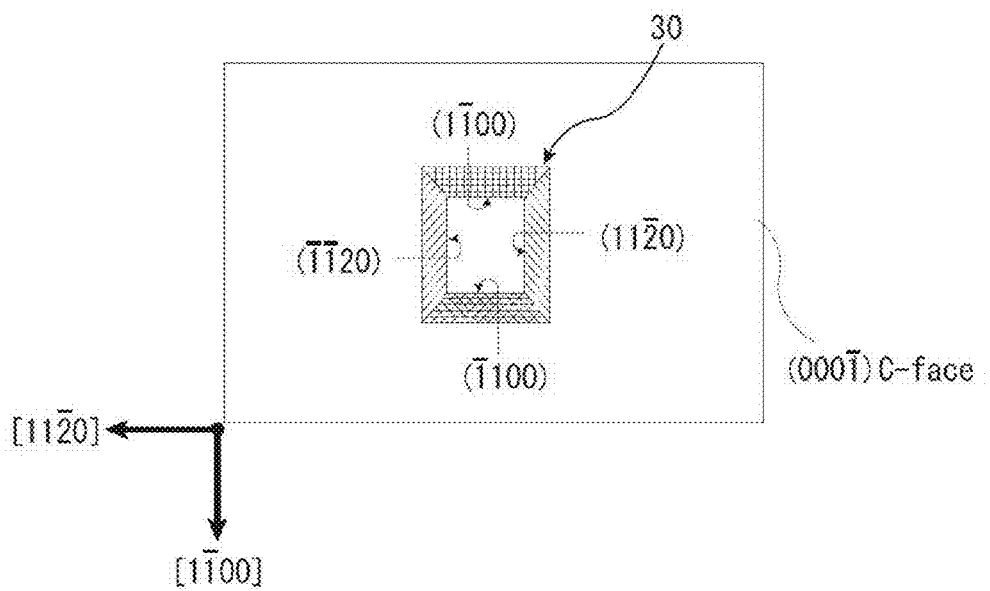
FIG. 6 schematically shows an example of crystal planes used as trench side walls.

FIG. 6 schematically shows an example of crystal planes used as trench side walls. FIG. 6 assumes the case where a rectangular trench is formed vertically in an SiC substrate on the (000-1) C-plane. There are four side walls and, in FIG. 6, the right, left (opposed to the right), upper, and lower side walls are, respectively, on the (11-20), (-1-120), (1-100), and (-1100) planes.

Figure 7:
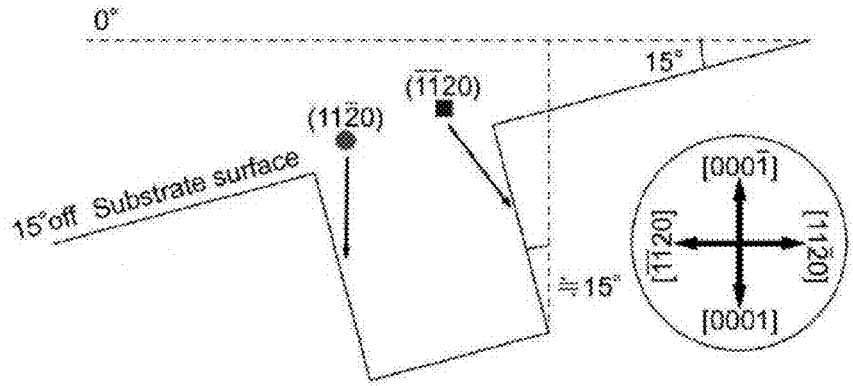
FIG. 7 illustrates crystal planes used as trench side walls.
Figure 8:
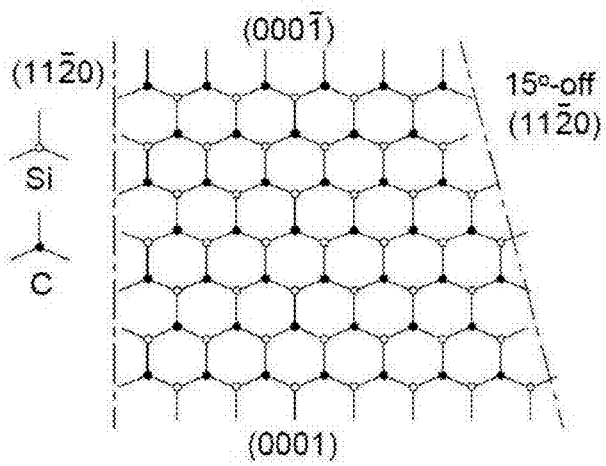
FIG. 8 illustrates a crystal plane according to the present invention.

FIG. 7 is a schematic cross-sectional view showing the case where trench side walls are formed approximately vertically in a substrate with the (000-1) C-plane having an off-angle of 15 degrees from the horizon (0 degrees). This is equivalent to the plane having an off-angle of 15 degrees in the [000-1] direction with respect to the (11-20) plane as shown in FIG. 8 schematically showing the structure of SiC crystal. That is, in a trench-gated MOSFET, the plane having an off-angle of 15 degrees in the [000-1] direction with respect to the (11-20) plane is used as a trench side wall.

Figure 9:
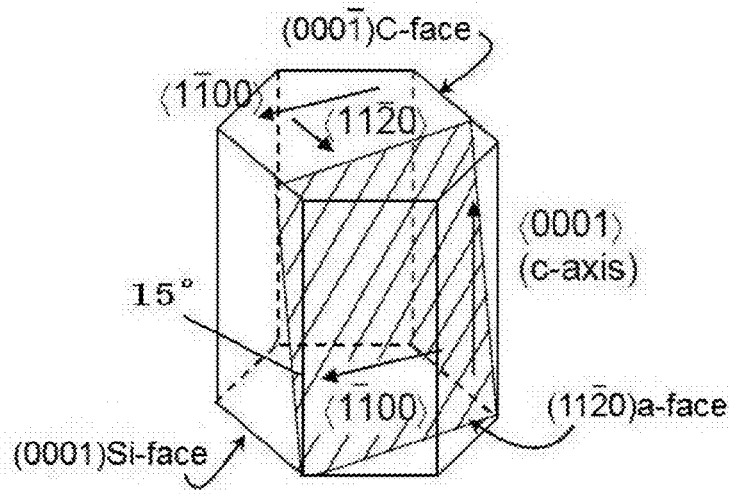
FIG. 9 illustrates a crystal plane according to the present invention.

FIG. 9 shows with hatching the plane having an off-angle of 15 degrees in the [000-1] direction with respect to the (11-20) plane in a unit cell structure of SiC crystal.

Figure 10:
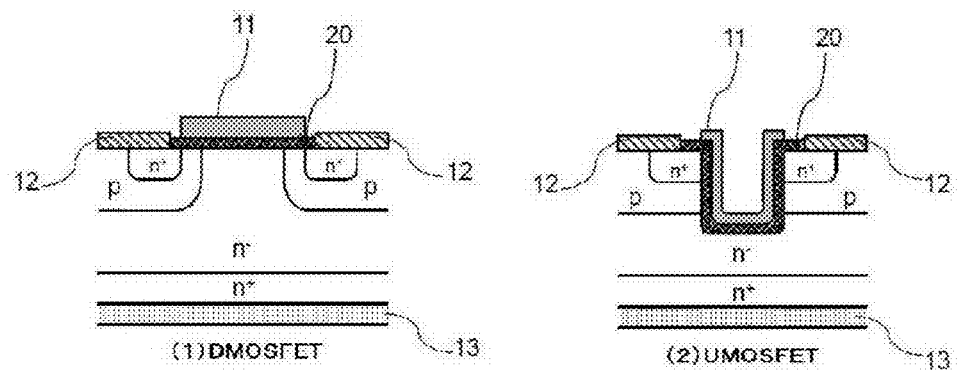
FIG. 10 schematically shows the structure of devices utilizing a crystal plane according to the present invention.

This plane has a high channel mobility as will be described in a first embodiment below and, if used as a portion to be in contact with a gate insulating film of such a DMOSFET or a UMOSFET as shown in FIG. 10, that is, as a crystal plane on which an insulating film is formed on the SiC semiconductor substrate, it is possible to significantly improve the device property.

Figure 11:
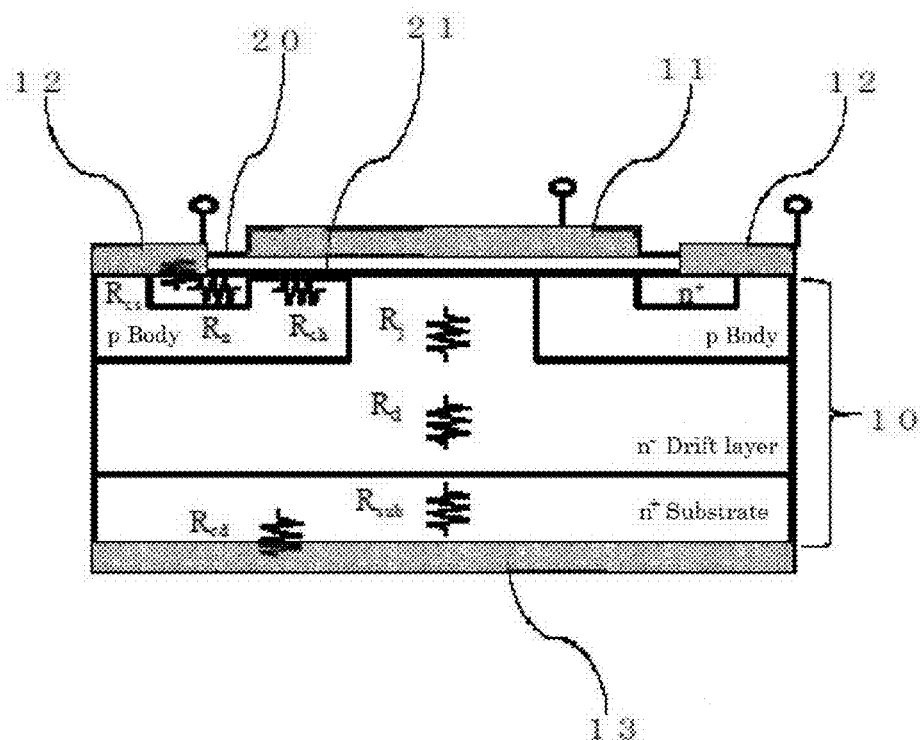
FIG. 11 schematically shows a DMOSFET as a typical example of SiC-based power MOSFETs.

This is explained in detail as follows. FIG. 11 schematically shows an SiC-based MOSFET. The SiC-based MOSFET includes an SiC semiconductor substrate 10 and a gate insulating film 20 formed on the substrate, and further includes terminals of a gate electrode 11, a source electrode 12, and a drain electrode 13. As shown in the figure, the SiC semiconductor 10 includes some separate layers such as an n$^+$ layer, a p body layers, an n$^-$ drift layer, and an n$^+$ substrate layer. There are sites offering resistance to the passage of current between the source electrode 12 and the drain electrode 13.

The sites include a resistance $R_{cs}$ between the source electrode 12 and the n$^+$ layer, a resistance $R_n$ in the n$^+$ layer, a channel resistance $R_{ch}$ at the interface 21 between the gate insulating film 20 and the SiC semiconductor 10, a JFET resistance $R_j$ in the n$^-$ drift layer sandwiched by the p body layers, a resistance $R_d$ in the n$^-$ drift layer, a resistance $R_{sub}$ in the n$^+$ substrate layer, and a resistance $R_{cd}$ between the n$^+$ substrate layer and the drain electrode 13. Among these resistances, the channel resistance $R_{ch}$ at the interface 21 is particularly predominant.

Figure 12:
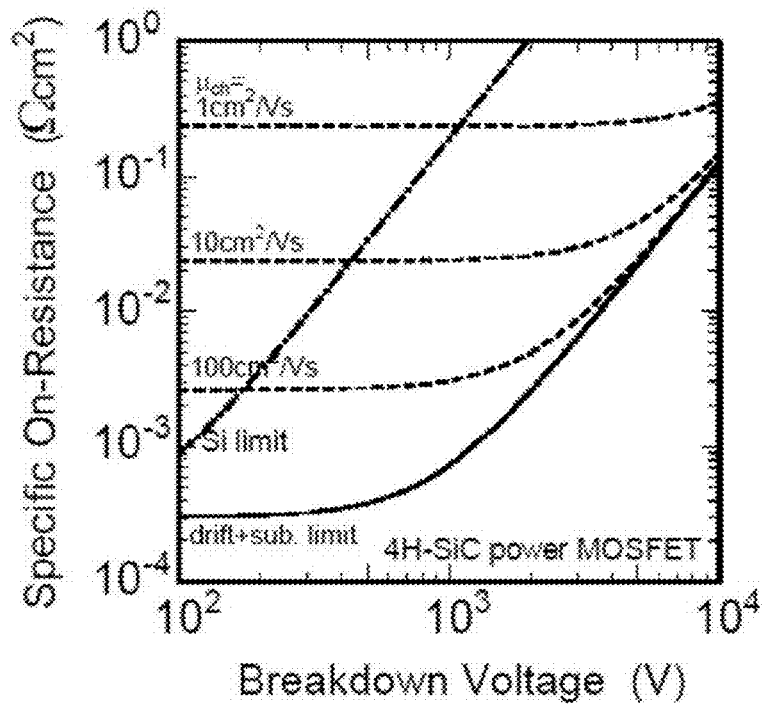
FIG. 12 shows a relationship between the on-resistance and the breakdown voltage of a MOSFET with the channel mobility used as a parameter.

The problem has heretofore been taken up that 4H—SiC bulk crystals have a high electron mobility of 800 to 1000 cm$^2$/Vs, while SiC-based MOSFETs have a low interface channel mobility of 10 cm$^2$/Vs. This will be described with reference to FIG. 12. FIG. 12 shows a relationship between the channel mobility ($\mu_{ch}$) and the on-resistance of transistors, where the horizontal axis represents the breakdown voltage, that is, the withstand voltage of the semiconductor devices.

In FIG. 12, comparing 4H—SiC and Si, specifically, comparing the on-resistance between a semiconductor device including silicon only (Si limit) and an SiC semiconductor including a drift layer and a substrate (drift+sub. limit) having the same breakdown voltage, the latter has a low on-resistance about one-thousandth that of the former at a breakdown voltage of around 10$^3$ V. It is also shown that the on-resistance decreases in inverse proportion to the channel mobility ($\mu_{ch}$).

It is noted that in SiC semiconductors, resistances other than the channel resistance and the resistances in the n$^-$ drift layer and the n$^+$ substrate layer can be disregarded in magnitude. It is particularly essential for an improvement in the performance of SiC semiconductor devices to reduce the channel resistance. Improving the interface channel mobility ($\mu_{ch}$) of SiC-based MOSFETs from about 10 cm$^2$/Vs, which has conventionally been exerted, to about 100 cm$^2$/Vs allows the originally high potential of 4H—SiC to be utilized.

[Embodiment 1]

A first embodiment shows results of a device property evaluation made by fabricating a trenched MOSFET (UMOSFET) device and forming a trench having approximately vertical side walls in an SiC substrate on the (000-1) C-plane having various off-angles.

Figure 13:
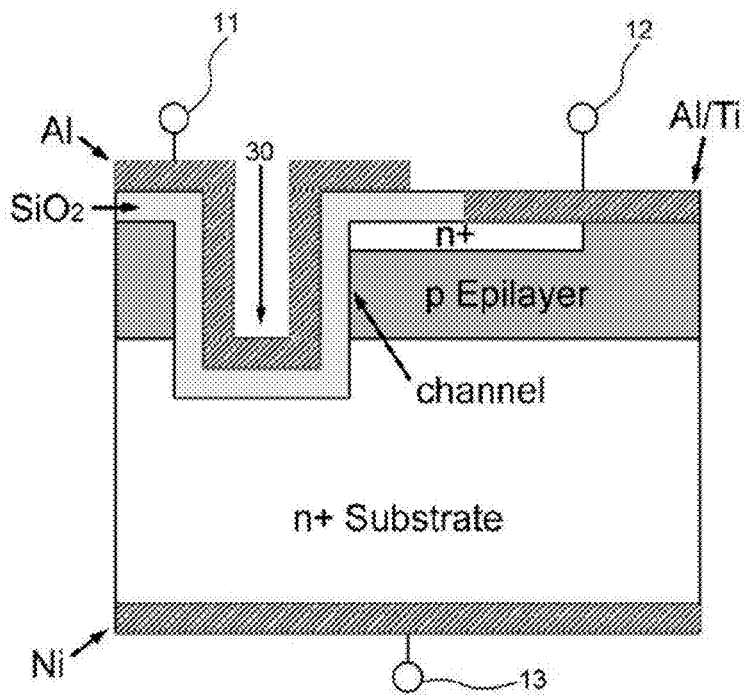
FIG. 13 schematically shows the structure of a trenched MOSFET fabricated.

FIG. 13 schematically shows the structure of the trenched MOSFET (UMOSFET) fabricated this time. For various off-angles, the trenched MOSFET was fabricated by forming a trench having approximately vertical side walls in an SiC substrate on the (000-1) C-plane, in which the current flows in only one side of the trench side walls.

Substrates fabricated using the (000-1) plane had their respective different off-angles of 0 degrees (i.e. on-axis), 4 degrees in the [-1-120] direction, 8 degrees in the [-1-120] direction, 15 degrees in the [-1-120] direction, and 8 degrees in the [1-100] direction. The trench was formed in a rectangular shape such that adjacent side walls were at right angles to each other and the four side walls were, respectively, on the (11-20), (-1-120), (1-100), and (-1100) planes. Since the substrates actually had an off-angle with respect to the (11-20) plane, for example, as shown in FIG. 7, the expression of, for example, (11-20), if provided here and in the following embodiments, actually indicates having a tilt angle derived from the substrate off-angle with respect to the (11-20) plane.

The acceptor density Na in the channel of the fabricated UMOSFET was 1 to 2×10$^{17}$ cm$^{-3}$, not expecting a higher mobility but to approximately simulate practical devices. An Si oxide film was formed through wet oxidation and thereafter through heat treatment using nitric oxide (NO) gas to form a gate insulating film (i.e. nitrided oxide film).

The UMOSFET was fabricated using aluminum as a gate electrode, aluminum-titanium alloy as a source electrode, and nickel as a drain electrode.

Figure 14:
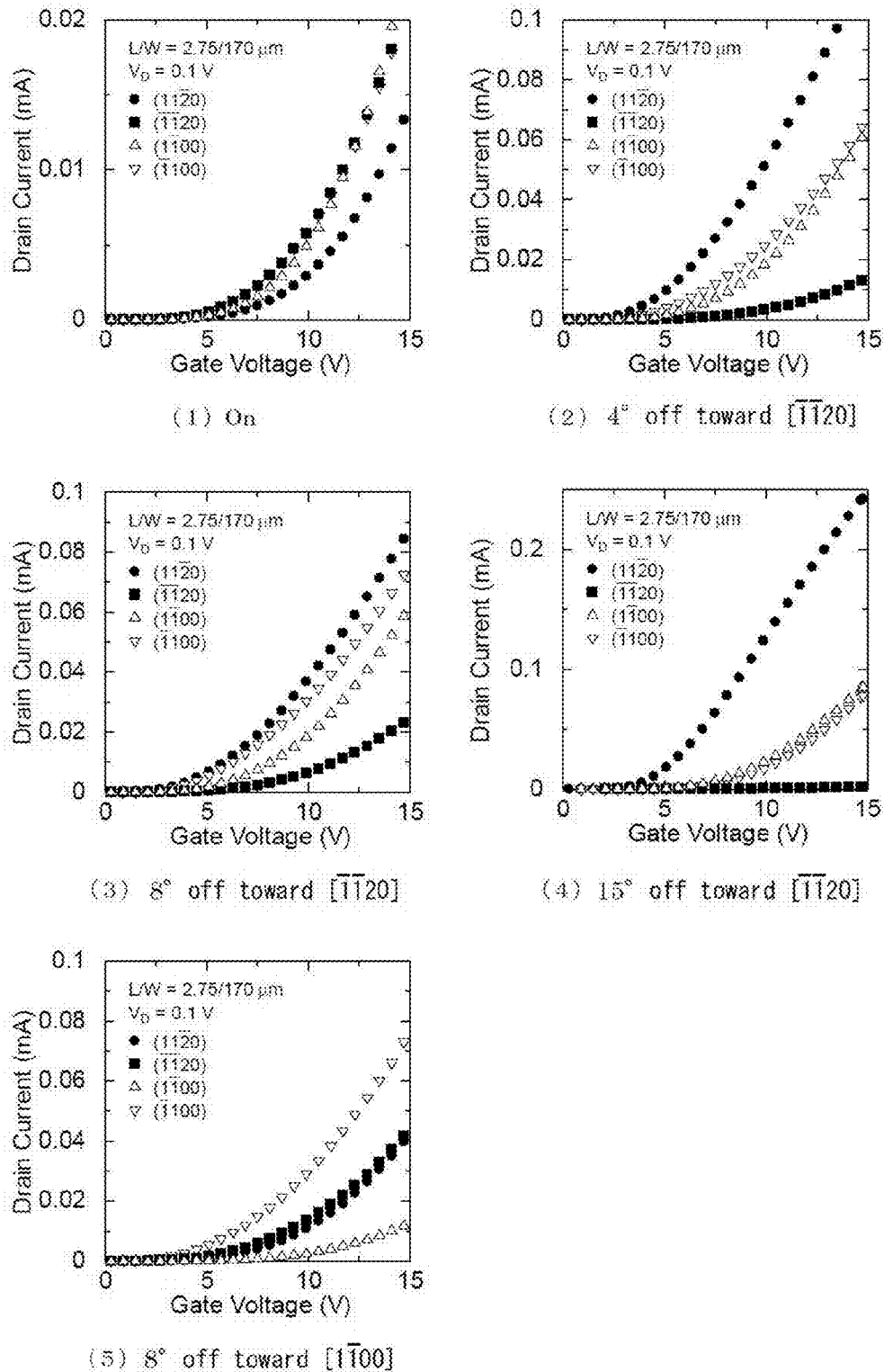
FIG. 14 is a graph showing the measurement results of the drain current characteristics of the fabricated UMOSFETs.

The graphs in FIG. 14 show measurement results of the drain current characteristics of the fabricated UMOSFETs.

FIGS. 14(1) to 14(5) plot measurement results, respectively, in the case of on-axis, 4 degrees off in the [−1-120] direction (a-plane direction in the figure), 8 degrees off in the [−1-120] direction, 15 degrees off in the [−1-120] direction, and 8 degrees off in the [1-100] direction (m-plane direction in the figure). It is confirmed from FIGS. 14(1) to 14(5) that the UMOSFET fabricated on the substrate having an off-angle of 15 degrees in the [−1-120] direction with respect to the (11-20) plane has the largest drain current (see FIG. 14(3)).

Figure 15:
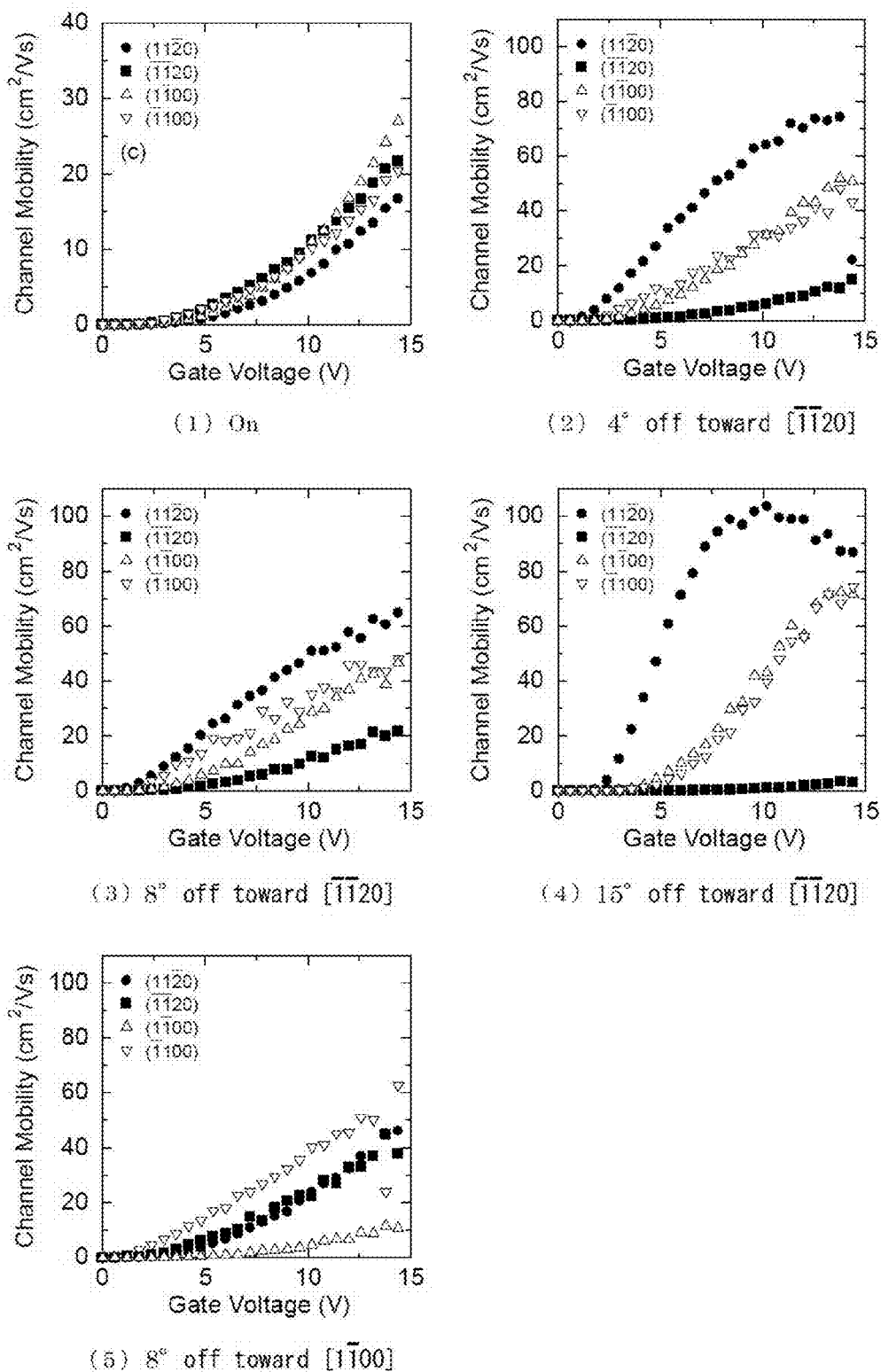
FIG. 15 is a graph showing the measurement results of the channel mobility of the fabricated UMOSFETs.

The graphs in FIG. 15 show measurement results of the channel mobility of the fabricated UMOSFETs. As is the case in FIG. 14, FIGS. 15(1) to 15(5) plot measurement results, respectively, in the case of on-axis, 4 degrees off in the [−1-120] direction (a-plane direction in the figure), 8 degrees off in the [−1-120] direction, 15 degrees off in the [−1-120] direction, and 8 degrees off in the [1-100] direction (m-plane direction in the figure). It is confirmed from FIGS. 15(1) to 15(5) that the UMOSFET fabricated on the substrate having an off-angle of 15 degrees in the [−1-120] direction with respect to the (11-20) plane has the highest channel mobility (see FIG. 15(3)).

Table 1 below summarizes maximum measured values of the channel mobility of the trenched MOSFETs fabricated on the substrates, respectively, having an off-angle of 4 degrees in the [−1-120] direction, 8 degrees in the [−1-120] direction, 15 degrees in the [−1-120] direction, and 8 degrees in the [1-100] direction for the (11-20), (−1-120), (1-100), and (−1100) planes.

It is confirmed from Table 1 below that among trench side walls formed approximately vertically in the substrate having an off-angle of 15 degrees in the [−1-120] direction with respect to the (000-1) C-plane, using the (11-20) plane shows the highest channel mobility of 103 cm$^2$/Vs and therefore an improved device property. The crystal plane of this side wall precisely has an off-angle of 15 degrees in the [000-1] direction with respect to the (11-20) plane as shown in FIG. 7.

TABLE 1

| Off angle/<br>Off direction | (11-20) | (−1-120) | (1-100) | (−1100) |
|---|---|---|---|---|
| 4°/[−1-120] | 80 | 18 | 60 | 58 |
| 8°/[−1-120] | 60 | 30 | 56 | 54 |
| 15°/[−1-120] | 103 | 4 | 72 | 74 |
| 8°/[1-100] | 49 | 46 | 14 | 68 |

In Table 1 above, the leftmost column represents the types of substrates on which a trenched MOSFET was fabricated, having an off-angle of a predetermined value in a predetermined direction with respect to the (000-1) plane. In Table 1, the uppermost row represents the crystal plane of trench side walls on which the mobility was measured. As an example, in the case of using the substrate with the off-direction of [−1-120], "(11-20)" means "the crystal plane has an off-angle of a predetermined value in the [000-1] direction with respect to the (11-20) plane."

Hereinafter, the reasons will be described why the crystal plane having an off-angle of 15 degrees in the [000-1] direction with respect to the (11-20) plane has a particularly high mobility.

Figure 16:
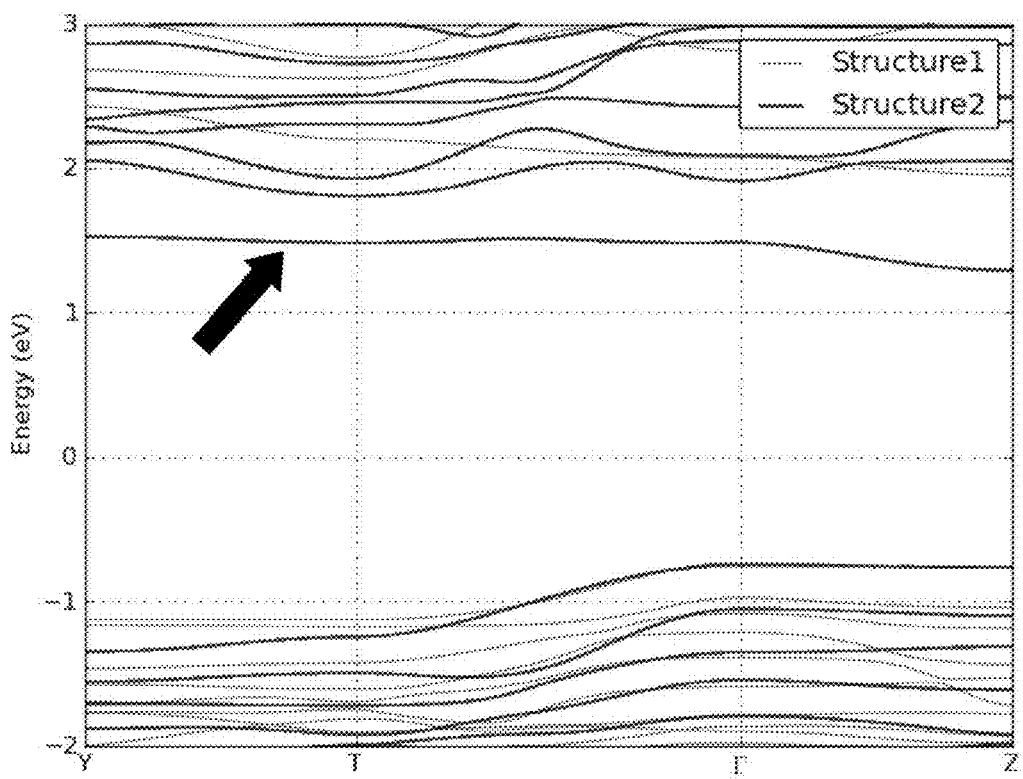
FIG. 16 shows a band structure at an SiO$_2$/SiC interface obtained through the first principle calculation.

FIG. 16 shows a band structure at an SiO$_2$/SiC interface obtained through the first principle calculation. In the graph shown in FIG. 16, the horizontal axis includes the respective points Y (0.0, 0.5, 0.0), T (0.0, 0.5, 0.5), Γ (0.0, 0.0, 0.0), and Z (0.0, 0.0, 0.5). In FIG. 16, Structure 1 shows a band structure of the crystal plane having an off-angle of 15 degrees in the [000-1] direction with respect to the (11-20) plane, while Structure 2 shows a band structure of the crystal plane having an off-angle of 15 degrees in the [0001] direction with respect to the (11-20) plane.

It is found from the band structure of Structure 2 in FIG. 16 that there exists a level running straight from Y to Γ in the lower part of the conduction band (indicated by an arrow in the figure). Here, it is noted that the smaller the curvature of the band curve, the larger the effective mass. Based on this, it is considered that electrons have an infinite effective mass at the level running straight and are localized to form a trap level. For this reason, Structure 2 includes many interface states to have a low mobility.

On the other hand, unlike Structure 2, Structure 1 includes no level running straight in the conduction band. That is, it is considered that Structure 1 has no electron localized to form a trap level and thereby includes only a few interface states to have a high mobility.

For various crystal planes having an off-angle of a predetermined value with respect to the (11-20) plane, an oxide film was formed and thereafter etched to measure the profile of the SiC surface with an AFM (atomic force microscope) and then provide a correspondence between the roughness (the maximum difference between the maximum and minimum heights) and the mobility.

Figure 17:
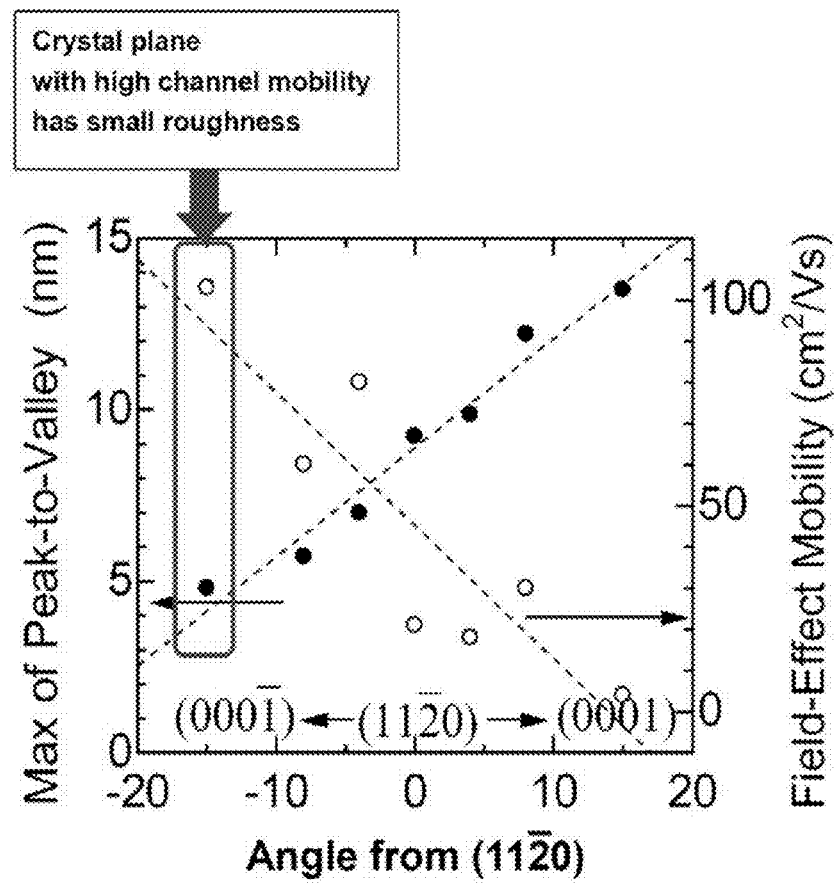
FIG. 17 is a graph showing the relationship between the roughness and the mobility on each crystal plane.

FIG. 17 is a graph showing the relationship between the roughness and the mobility on each crystal plane. The horizontal axis of the graph represents the tilt angle, that is, the (11-20) plane has a tilt angle of 0 degrees, the plane tilted in the [000-1] direction with respect to the (11-20) plane has a negative angle, and the plane tilted in the [0001] direction with respect to the (11-20) plane has a positive angle. The left vertical axis (Max of Peak-to-Valley) of the graph represents the roughness, that is, the maximum difference between the maximum and minimum wave heights of the interface in nanometers. The right vertical axis of the graph represents the field-effect mobility. In the graph shown in FIG. 17, solid circles plot the roughness, while open circles plot the field-effect mobility.

Figure 18:
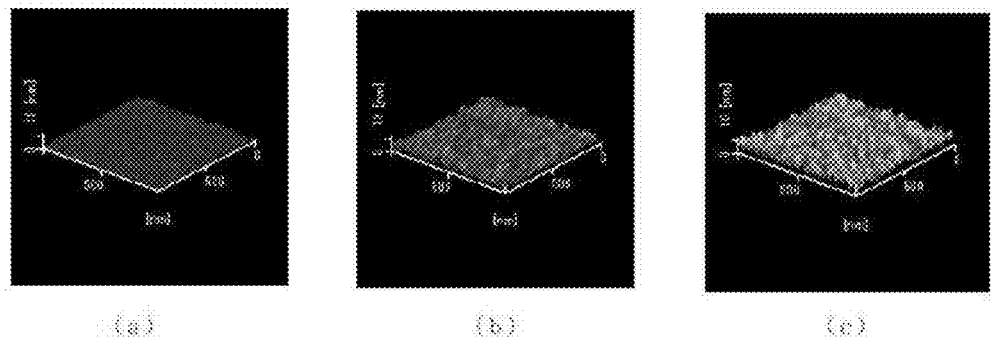
FIG. 18 shows AFM images of each crystal plane: (a) is the crystal plane having an off-angle of 15 degrees in the [000-1] direction with respect to the (11-20) plane, (b) and (c) are the crystal planes having an off-angle of 15 degrees in the [0001] direction with respect to the (11-20) plane.

FIG. 18 shows AFM images of each crystal plane. Here, FIG. 18(a) is the crystal plane having an off-angle of 15 degrees in the [000-1] direction with respect to the (11-20) plane, FIG. 18(b) is the crystal plane of the (11-20) plane, and FIG. 18(c) is the crystal planes having an off-angle of 15 degrees in the [0001] direction with respect to the (11-20) plane.

It is confirmed from FIGS. 17 and 18 that there is a big difference in the roughness at the SiO$_2$/SiC interface between the respective crystal planes.

Specifically, the crystal plane shown in FIG. 18(a), that is, having an off-angle of 15 degrees in the [000-1] direction with respect to the (11-20) plane has a small roughness. FIG. 18(b) and rather FIG. 18(c) exhibit a larger roughness.

It is found from these results that planes with a high mobility have a small roughness and thereby are formed with a uniform inversion layer channel. However, it is considered that the larger the roughness, the more non-uniform the inversion layer becomes, resulting in breaking the channel and resisting the flow of the drain current and, accordingly, having a low mobility.

Based on the findings above, the reasons why the crystal plane having an off-angle of 15 degrees in the [000-1] direction with respect to the (11-20) plane has a particularly high mobility are that the plane includes only a few interface states and that the plane has a small roughness and can be formed with a uniform inversion layer.

(Other Embodiments)

It has been described in the first embodiment that the crystal plane having an off-angle of 15 degrees in the [000-1] direction with respect to the {11-20} plane has a high channel mobility. Similarly, it is found from the foregoing results that the crystal plane having an off-angle of 15 degrees in the [000-1] direction with respect to the {10-10} plane also has a high channel mobility. That is, referring to the results of the substrate having an off-angle of 8 degrees in the [1-100] direction in the lowermost row of Table 1, using the (−1100) plane achieves a higher channel mobility than using the (1-100) plane.

The crystal plane (−1100) shown here precisely has an off-angle of 8 degrees in the [000-1] direction with respect to the {10-10} plane. The crystal planes {10-10} and {11-20} are both perpendicular to the (000-1) plane and have similar properties, for example, the atomic ratio of carbon and silicon appearing on the surface is 1:1.

The following can further be analogized easily from the results of the substrates having an off-angle of 8 degrees and 15 degrees in the [−1-120] direction. That is, using the substrate having an off-angle of 15 degrees in the [1-100] direction can achieve a higher channel mobility on the (−1100) plane than using that having an off-angle of 8 degrees. This can be translated that the crystal plane having an off-angle of 15 degrees in the [000-1] direction with respect to the {10-10} plane can achieve a higher channel mobility than that having an off-angle of 8 degrees.

Furthermore, as mentioned above, the {−12-10} and {11-20} planes and the {10-10} and {1-100} planes have similar atomic arrangement structures out of alignment by half the unit cell structure in the axial direction, all achieving a higher channel mobility.

INDUSTRIAL APPLICABILITY

The present invention is useful for MIS (MOS) field effect transistors for use in inverter switches of, for example, electric vehicles, hybrid vehicles, rail vehicles, home appliances, and power systems. The present invention is also applicable to insulated gate bipolar transistors (IGBT), which are used in higher withstand voltage regions than MIS (MOS) FETs.

The present invention is further applicable to surface passivation films of, for example, gate turn-off (GTO) thyristors, bipolar junction transistors (BJT), junction field effect transistors (JFET), P-i-N diodes, and Schottky barrier diodes (SBD). Moreover, the present invention may be used to fabricate lateral power MOSFETs (RESURF MOSFET) available for, for example, integrated power ICs and IPMs.

DESCRIPTION OF SYMBOLS

10 SiC semiconductor
11 gate electrode
12 source electrode
13 drain electrode
20 gate insulating film
21 interface
30 trench

What is claimed is:

1. An SiC semiconductor device comprising at least an SiC semiconductor substrate and an insulating film in contact with the substrate, wherein
the insulating film is formed on a crystal plane of the SiC semiconductor substrate, the plane having an off-angle of 10 to 20 degrees in the [000-1] direction with respect to the {11-20} plane or having an off-angle of 70 to 80 degrees in the <11-20> direction with respect to the (000-1) plane.

2. The SiC semiconductor device according to claim 1, wherein
the insulating film is formed on a crystal plane of the SiC semiconductor substrate, the plane having an off-angle of 15 degrees in the [000-1] direction with respect to the {11-20} plane or having an off-angle of 75 degrees in the <11-20> direction with respect to the (000-1) plane.

3. The SiC semiconductor device according to claim 2, having a channel mobility of 90 cm$^2$/Vs or more.

4. The SiC semiconductor device according to claim 2, wherein
the crystal plane is used as a trench side wall of a trench-gated MOSFET using the SiC semiconductor substrate.

5. The SiC semiconductor device according to claim 2, wherein
the insulating film is used as a gate insulating film or a surface passivation film.

6. An SiC semiconductor device comprising at least an SiC semiconductor substrate and an insulating film in contact with the substrate, wherein
the insulating film is formed on a crystal plane of the SiC semiconductor substrate, the plane having an off-angle of 10 to 20 degrees in the [000-1] direction with respect to the {1-100} plane or having an off-angle of 70 to 80 degrees in the <1-100> direction with respect to the (000-1) plane.

7. The SiC semiconductor device according to claim 6, wherein
the insulating film is formed on a crystal plane of the SiC semiconductor substrate, the plane having an off-angle of 15 degrees in the [000-1] direction with respect to the {1-100} plane or having an off-angle of 75 degrees in the <1-100> direction with respect to the (000-1) plane.

8. The SiC semiconductor device according to claim 7, having a channel mobility of 90 cm$^2$/Vs or more.

9. The SiC semiconductor device according to claim 7, wherein
the crystal plane is used as a trench side wall of a trench-gated MOSFET using the SiC semiconductor substrate.

10. The SiC semiconductor device according to claim 7, wherein
the insulating film is used as a gate insulating film or a surface passivation film.

11. An SiC semiconductor device comprising at least an SiC semiconductor substrate and an insulating film in contact with the substrate, wherein
the insulating film is formed on a crystal plane of the SiC semiconductor substrate, the plane having an off-angle of 10 to 20 degrees in the [000-1] direction with respect to the {−12-10} plane or having an off-angle of 70 to 80 degrees in the <−12-10> direction with respect to the (000-1) plane.

12. The SiC semiconductor device according to claim 11, wherein
the insulating film is formed on a crystal plane of the SiC semiconductor substrate, the plane having an off-angle of 15 degrees in the [000-1] direction with respect to the {−12-10} plane or having an off-angle of 75 degrees in the <−12-10> direction with respect to the (000-1) plane.

13. The SiC semiconductor device according to claim 12, having a channel mobility of 90 cm$^2$/Vs or more.

14. The SiC semiconductor device according to claim 12, wherein the crystal plane is used as a trench side wall of a trench-gated MOSFET using the SiC semiconductor substrate.

15. The SiC semiconductor device according to claim 12, wherein
the insulating film is used as a gate insulating film or a surface passivation film.

16. An SiC semiconductor device comprising at least an SiC semiconductor substrate and an insulating film in contact with the substrate, wherein
the insulating film is formed on a crystal plane of the SiC semiconductor substrate, the plane having an off-angle of 10 to 20 degrees in the [000-1] direction with respect to the {10-10} plane or having an off-angle of 70 to 80 degrees in the <10-10> direction with respect to the (000-1) plane.

17. The SiC semiconductor device according to claim 16, wherein
the insulating film is formed on a crystal plane of the SiC semiconductor substrate, the plane having an off-angle of 15 degrees in the [000-1] direction with respect to the {10-10} plane or having an off-angle of 75 degrees in the <10-10> direction with respect to the (000-1) plane.

18. The SiC semiconductor device according to claim 17, having a channel mobility of 90 $cm^2/Vs$ or more.

19. The SiC semiconductor device according to claim 17, wherein
the crystal plane is used as a trench side wall of a trench-gated MOSFET using the SiC semiconductor substrate.

20. The SiC semiconductor device according to claim 17, wherein
the insulating film is used as a gate insulating film or a surface passivation film.

\* \* \* \* \*